United States Patent
Fischer et al.

(10) Patent No.: US 7,003,263 B2
(45) Date of Patent: Feb. 21, 2006

(54) TELECOMMUNICATIONS RECEIVER AND A TRANSMITTER

(75) Inventors: Georg Fischer, Bavaria (DE); Kai-Uwe Ritter, Bavaria (DE)

(73) Assignee: Lucent Technologies Inc., Murray Hill, NJ (US)

( * ) Notice: Subject to any disclaimer, the term of this patent is extended or adjusted under 35 U.S.C. 154(b) by 428 days.

(21) Appl. No.: 10/435,959

(22) Filed: May 12, 2003

(65) Prior Publication Data

US 2004/0229584 A1    Nov. 18, 2004

(51) Int. Cl.
*H04B 1/00* (2006.01)
*H04B 1/26* (2006.01)

(52) U.S. Cl. ............... 455/63.1; 455/67.13; 455/114.2; 455/296; 455/324; 375/296; 375/302; 375/324

(58) Field of Classification Search ............... 455/63.1, 455/67.13, 110, 112, 114.2, 296, 313, 314, 455/323, 324, 334; 375/296, 298, 302, 319, 375/322, 346

See application file for complete search history.

(56) References Cited

U.S. PATENT DOCUMENTS

| | | | | |
|---|---|---|---|---|
| 4,736,390 A | * | 4/1988 | Ward et al. | 455/324 |
| 5,396,196 A | * | 3/1995 | Blodgett | 455/114.2 |
| 5,438,692 A | * | 8/1995 | Mohindra | 455/324 |
| 5,584,059 A | * | 12/1996 | Turney et al. | 455/114.2 |
| 5,724,653 A | * | 3/1998 | Baker et al. | 375/346 |
| 5,748,681 A | * | 5/1998 | Comino et al. | 375/319 |
| 6,032,028 A | * | 2/2000 | Dickey et al. | 455/110 |
| 6,148,047 A | * | 11/2000 | Mohindra | 375/346 |
| 6,658,070 B1 | * | 12/2003 | Domokos | 375/346 |

* cited by examiner

*Primary Examiner*—Quochien B. Vuong

(57) ABSTRACT

In a telecommunications transmitter and receiver two IQ-mixers of the same type are operated in 180 degrees phase shift. In both the transmitter and receiver, an input signal is coupled to each IQ-mixer and the output signal of the mixers are combined so as to cancel unwanted error components in each individual output signal. In the transmitter, residual carrier signals are cancelled, and in the receiver, DC-offsets are cancelled. In both, the wanted signals are added, doubling the amplitude of the resultant output signal leading to four times more output power and improved dynamic range.

15 Claims, 5 Drawing Sheets

TELECOMMUNICATIONS RECEIVER AND A TRANSMITTER

TECHNICAL FIELD

The present invention relates to a telecommunications receiver and a telecommunications transmitter.

BACKGROUND OF THE INVENTION

In the field of receiver and transmitter technology for mobile telecommunications to date, only receivers incorporating fixed analog intermediate frequency (IF) stages have been found suitable for use in base stations. This is because of the large range of power levels which must be handled, and also a requirement for a low level of blocking. The range of power levels is often called the dynamic range and is usually quantified as the ratio between strongest and weakest usable power levels. Blocking is, of course, the problem of a weaker signal being drowned out by a stronger signal.

Direct conversion receivers with zero or near-zero IF stages are becoming available. However they are only suitable for use in mobile user terminals but not base stations because power range and blocking requirements of mobile user terminals are much less demanding than those of base stations. Direct down-conversion receivers are known to suffer from the problem of direct current (DC) offsets in their IQ-mixers, which limits the useful dynamic range. Incidentally, IQ-mixers are also known in the art as I/Q modulators and quadrature mixers, where I refers to the in-phase component of a signal and Q refers to the quadrature phase component.

A so-called Othello chipset for mobile user terminals is known, which incorporates a zero IF direct conversion receiver for triple-band operation (GSM 900, 1800, 1900 MHz bands). A chipset for mobile user terminals is also known which operates with a near zero IF, namely 100 kHz. Such chipsets use Variable Gain Amplifiers (VGA) as part of an automatic gain control (AGC) loop to cope with the dynamic range requirements of the mobile user terminal. To compensate for the direct current (DC) offset, averaging over a long time period is used to estimate the DC-offset correction to be applied.

The DC-offset in a direct down-conversion receiver limits performance. Accurate detection is not possible when the DC-offset is stronger than the wanted signal as occurs with weak input signals. In consequence, the dynamic range of the analog to digital converter (ADC) used to sample the in-phase (I) and quadrature phase (Q) signal components is often insufficient; the dynamic range then being the ratio of the strongest received signal to the DC-offset rather than to the weakest received signal.

As regards transmitters, direct up-conversion can be used, although a high level of carrier signal suppression is often required. Direct up-conversion modulators each consisting of an IQ mixer are available in the marketplace. However, the powers used in base stations are often near to the minimum powers which these modulators can handle, i.e. the "noisefloor". Such modulators typically offer carrier signal suppression in the order of 35 dB without tuning. However, to improve carrier suppression, a manual or automatic tuning process is used involving e.g. adjustment of variable resistors and/or capacitors so as to compensate for slight differences in gains and delays between the I and Q branches of the IQ mixer.

The limited carrier suppression capability of known direct up-conversion mixers limits their performance. Amplitude modulation applied to the I and Q input signals is limited by the carrier signal suppression because the minimum amplitude of each of the I and Q signals equals the level of the carrier after suppression. Also the suppressed carrier generates some distortion, called error vector magnitude (EVM), of the output signal. This distortion adds to the wanted signal as a rotating phasor or a displacement in the IQ-plane.

SUMMARY OF THE INVENTION

Embodiments of receivers and transmitters in accordance with the present invention realize that two circuits of the same type, and possibly integrated on the same chip, normally behave very similarly. In these embodiments, using two IQ-mixer stages, which are operated in 180 degrees phase shift, results in the error components of the output signals being cancelled. Embodiment of the receivers and transmitters in accordance with the present invention thus preferably involve the use of two IQ-mixers of the same type in order to cancel out unwanted components of output signals. In the receivers, DC-offsets are cancelled. In the transmitters, residual carrier signals are cancelled. Also, for both transmitters and receivers, the wanted signals are added which doubles the amplitude of the output signal and leads to four times more output power, thus also giving an improved dynamic range on the output.

An embodiment of the present invention is a telecommunications receiver having first and second IQ mixers of the same type. The second mixer is provided an input signal in antiphase to the phase of the received signal input to the first mixer. Each mixer outputs an I signal and a Q signal. The I signal from the second mixer is in phase or antiphase to the I signal from the first mixer, and the Q signal from the second mixer is in phase or in antiphase to the Q signal from the first mixer. The I and Q signals each include a respective DC offset component. A first output signal is produced, which is the sum of the two I signals when the two I signals are in opposite phases or the difference between the two I signals when they are of the same phase, such that the DC offset components of the I signals at least partially cancel. Also a second signal is produced being the sum of the two Q signals when the two Q signals are of opposite phase or the difference between the two Q signals when they are of the same phase, such that the DC offset components of the Q signals at least partially cancel.

Another embodiment of the present invention is a telecommunications transmitter having first and second IQ mixers of the same type. Each mixer is provided with an I signal and a Q signal. The I signal input to the second mixer is in phase with the I signal input to the first mixer. The Q signal input to the second mixer is in phase with the Q signal input to the first mixer. The second mixer provides an output signal in antiphase to an output signal provided by the first mixer, each output signal including a residual carrier component. A signal for transmission is provided by combining the two output signals by phase shifting one of the signals by 180 degrees and adding this to the other output signal, such that the residual carrier components at least partially cancel.

Embodiments of the present invention can also provide significant other advantages. As regards receiver embodiments, DC offsets are cancelled in real time, independent of the signal strength, frequency, or the level of the local oscillator (LO) input signals to the mixers. A further advantage is that any feedthrough of the local oscillator signal in the reverse direction is cancelled in the 180° power combiner at the input to the receiver.

As regards transmitter embodiments, carrier suppression is improved by cancelling out the individual residual carrier signals, e.g. residual local oscillator signals, of each IQ-mixer in the 180° combiner. Furthermore, the noisefloor, i.e. minimum signal power to be handled, is improved by 3 dB as the noise of both IQ-mixers is not correlated, but the wanted signals processed by the two mixers are correlated.

As regards further advantages of embodiments of both receivers and transmitters, device dependant effects, such temperature drifts, are fully compensated for as they are the same for the two IQ-mixers of the same type. A further advantage of receiver embodiments is that a need of the prior art to tune gain and delay differences between I and Q branches (as discussed above) is avoided.

DETAILED DESCRIPTION

Embodiments of receivers are described below. Conversion is direct from radio frequency (RF) to baseband (i.e. Direct Current). Embodiments of transmitters are then described involving baseband to RF conversion, also without an intermediate frequency (IF) conversion stage.

A First Receiver

Figure 1:
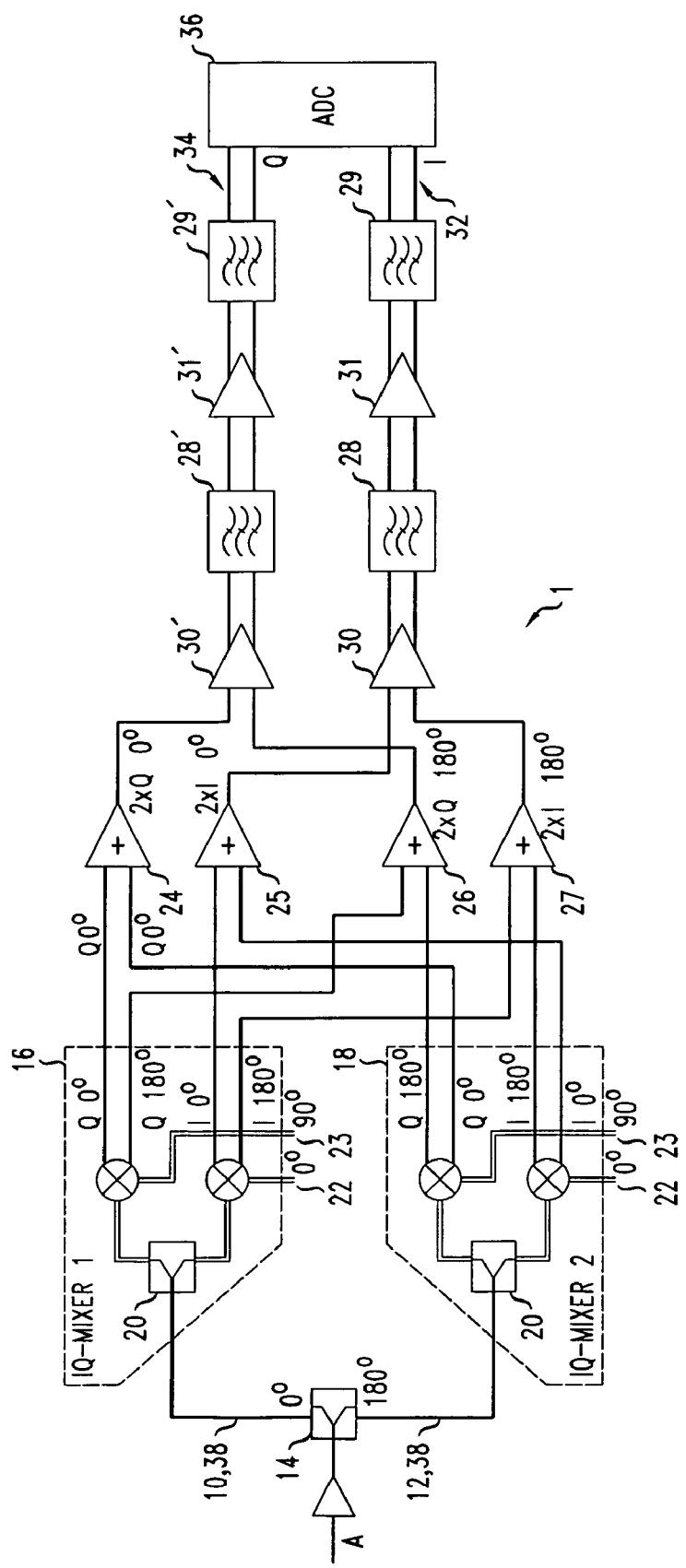
FIG. 1 is a diagram illustrating a first embodiment of a receiver in accordance with the invention.

In a first receiver embodiment 1 as shown in FIG. 1, the input signal A is amplified by an amplifier DRV and split into two paths 10,12, a path 10 with no phase shift and a path 12 with a phase shift of 180 degrees. One way to achieve the phase shift is to use a 180° Hybrid 14, to ensure that the signal levels are the same for both paths 10,12.

Signals on each of the paths 10,12 are then processed by a respective IQ mixer 16,18, each of which uses two LO-signals, one 22 with 0° phase shift and one 23 with 90° phase shift. The IQ-mixers 16,18 for both paths 10,12 are identical in structure. Each mixer 16,18 incorporates a splitter 20 and signal inputs 22,23 from a local oscillator (LO, not shown). Both IQ-mixers are implemented on the same integrated circuit chip. The length of the connectors 38 from the 180° Hybrid 14 to each splitter 20 is the same.

Due to imperfections of the IQ-mixers 16,18 an unwanted DC offset appears at the outputs of the IQ-mixers 16,18. Each I output of IQ-mixer 2 is 180° phase shifted compared to the corresponding I output of IQ-mixer 1. However, the DC offsets from the two IQ-mixers 16,18 are not shifted in phase. The same applies for the Q outputs also.

All the outputs are cross-connected to adder stages 24,25, 26,27, the I and Q components with the same phase being connected so that they add. At each adder, one of the two inputs has a DC offset shifted by 180° relative to the other. Accordingly, the DC offsets are cancelled by the adders.

After some amplification by differential variable gain amplifiers (denoted 30,31 in FIG. 1 for I signals, denoted 30',31' in FIG. 1 for Q signals) and baseband filtering by low pass filters (denoted 28,29 in FIG. 1 for I signals, denoted 28',29' in FIG. 1 for Q signals), the I and Q signals (I signal 32 and Q signal 34, each having in phase and anti-phase components) are sampled by an analog to digital converter (ADC) 36 and then demodulated and decoded by processing stages (not shown). In this example, the ADC has a baseband input power of 10 dBm maximum.

Another effect of imperfections of IQ-mixers is the feedthrough of LO-signal to the input of the IQ-mixer. In the described embodiment, these residual signals would arrive with the same level back at the output of the 180° Hybrid 14, which splits the input signal. In this case it operates in an opposite manner such that the residual signals are added at the input to the 180° Hybrid 14, but as they are 180° shifted in phase the two residual signals cancel.

All of the cancellation effects work in real time.

A Second Receiver

Figure 2:
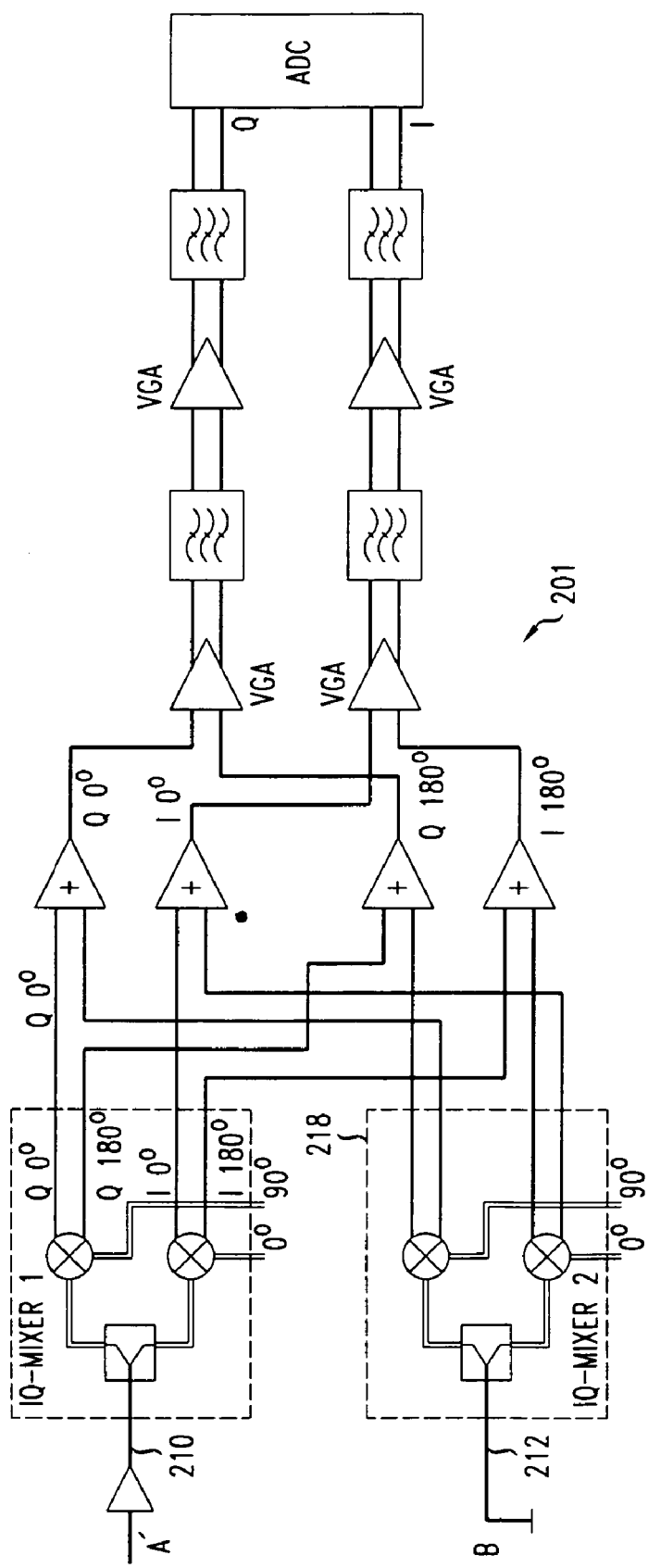
FIG. 2 is a diagram illustrating a second embodiment of a receiver.

A second receiver embodiment 201 is shown in FIG. 2. This receiver has essentially the same structure and function as the receiver shown in FIG. 1 except that the input signal A' is directed to one path 210 (so there is no 180° Hybrid). A reference signal B which is zero is provided instead to the other path 212 so that the second IQ-mixer 218 is used to generate a reference DC offset which is then used for cancellation purposes as in the receiver in FIG. 1. As cancellation of effects which are dependent of the input signal level are not taken into account, the performance of this embodiment may be lower than the receiver in FIG. 1.

Other Receivers

Figure 3:
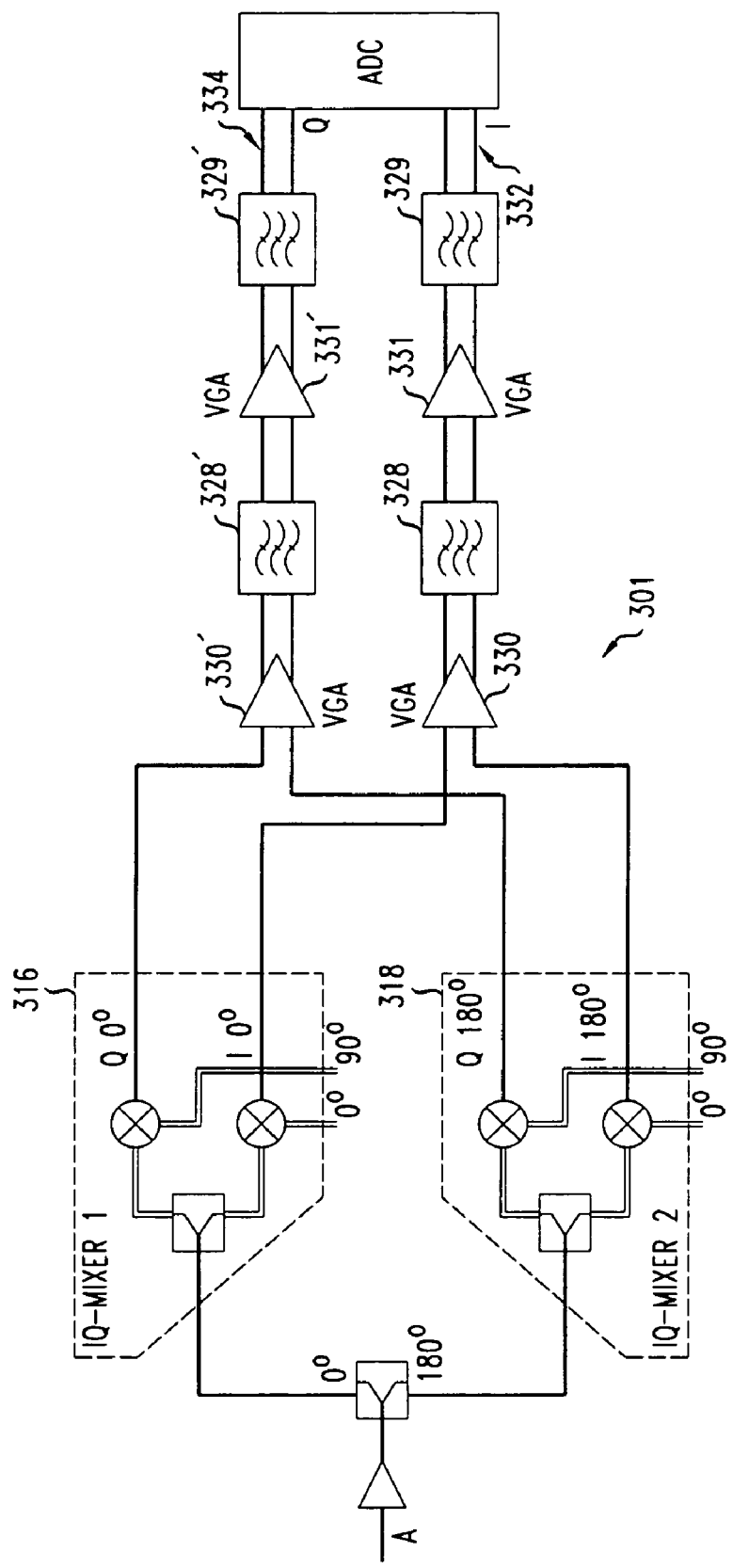
FIG. 3 is a diagram illustrating a third embodiment of a receiver.

A third receiver 301 is shown in FIG. 3. In this receiver, the I and Q signals from each IQ-mixer 316, 318 are provided as unbalanced signals to the differential variable gain amplifiers 330. Specifically, the 0° phase I component from IQ-mixer 316 and the 180° phase I component from IQ-mixer 318 are passed through a respective differential variable gain amplifier 330 and low pass filter 328 then through a further respective differential variable gain amplifier 331 and further low pass filter 329 to provide the I signal 332 at baseband frequency. In similar fashion, the 0° phase Q component from IQ-mixer 316 and the 180° phase Q component from IQ-mixer 318 are passed through a respective differential variable gain amplifier 330' and low pass filter 328' then through a further respective differential variable gain amplifier 331' and further low pass filter 329' to provide the Q signal 334 at baseband frequency. Adders (see reference numerals 24,25,26,27 in FIG. 1 for comparison) are thus not required. As any DC offset is of 0° phase in the I and Q components provided by the IQ-mixers 316,318, each differential variable gain amplifier 330,330' only amplifies the difference between its two inputs, the DC offset in the two inputs being cancelled by this operation.

In another receiver embodiment (not shown) otherwise similar to the first receiver shown in FIG. 1, the amplifier DRV is a differential amplifier having input signals +A and −A.

A First Transmitter

Figure 4:
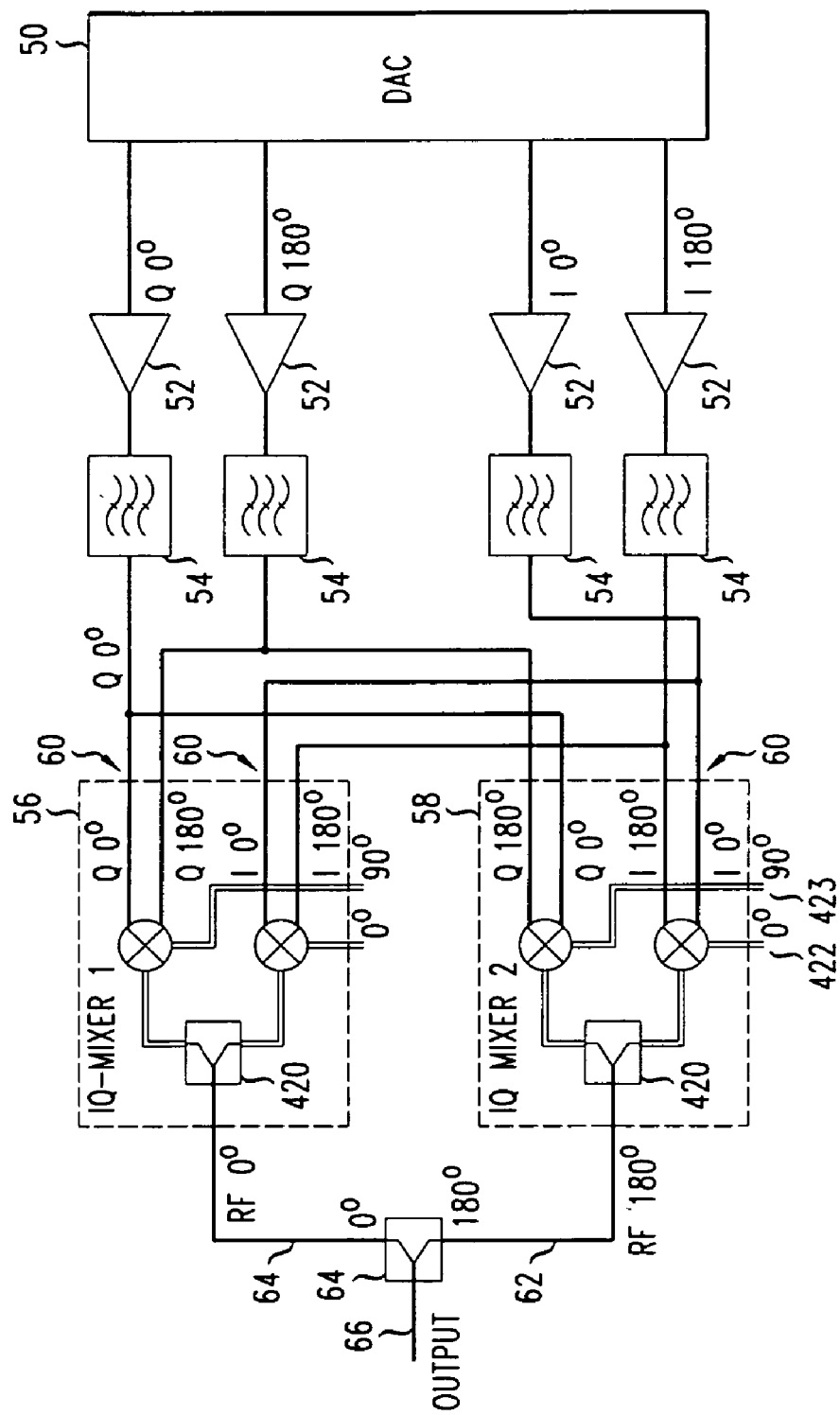
FIG. 4 is a diagram illustrating a first embodiment of a transmitter in accordance with the invention.

As shown in FIG. 4, in a first transmitter embodiment, I and Q analog signals are generated by an encoder (not shown) connected to a digital to analog converter (DAC) 50. After amplification by amplifiers 52 and lowpass filtering by filters 54, the I and Q signals both in phase and in antiphase are fed to two identical IQ mixers 56,58. The signal inputs 60 are connected in reverse order at IQ-mixer 2 (reference numeral 58) compared to IQ mixer 1 (reference numeral 56) as shown in the Figure. Each mixer 56,58 includes a combiner 420 and signal inputs 422,423 from a local oscillator (not shown).

At the output 62 of IQ-mixer 2 (reference numeral 58) the signal is shifted in phase by 180° compared to the output 64 of IQ-mixer 1 (reference numeral 56). The signal at each output 62, 64 includes a residual carrier signal. The residual carrier signal arises in particular due to crosstalk from the LO as a result of some capacitive coupling, further due to some DC at the signal inputs 60 in consequence of tolerances in the generation and handling of in-phase and in antiphase I and Q signals, and due to some impedance mismatches. The residual carrier signal at each of the outputs 62, 64 of the IQ-mixers 56, 58 have the same phase. In consequence, at the 180° hybrid 64, which acts as a combiner, the wanted signals are added and the unwanted residual carrier signals are cancelled, the resultant signal being provided at the output 66.

Other Transmitters

In another embodiment (not shown), another source also having balanced (i.e. symmetric) outputs is used in place of the encoder and DAC 50 in the transmitter configuration shown in FIG. 4.

Figure 5:
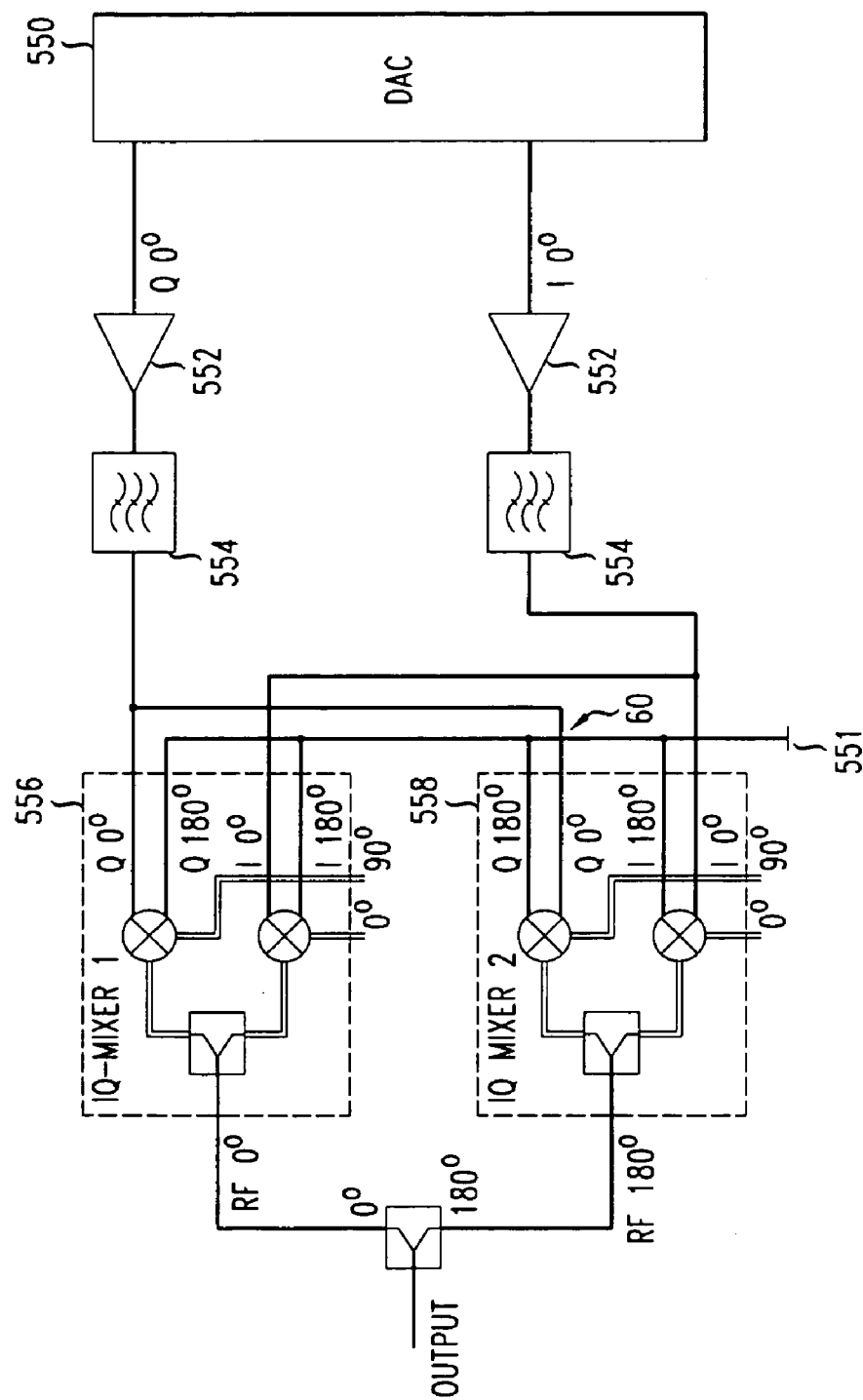
FIG. 5 is a diagram illustrating a second embodiment of a transmitter.

In another embodiment as shown in FIG. 5, an I and Q signal source with unbalanced (i.e. unsymmetric) outputs is used instead. The signal source is a digital to analog converter (DAC) 550. In this embodiment, only in-phase, i.e. 0 degrees, I and Q signal components are provided by the DAC 550. After amplification 552 and low pass filtering 554, the signal components are provided to each IQ mixer 556, 558, the antiphase (i.e. 180 degrees) input ports of which are grounded (ground 551).

Abbreviations
ADC Analog to digital converter
AGC Automatic gain control
DC Direct current
I In-phase
IF Intermediate frequency
LO Local oscillator
Q Quadrature phase
RX Receiver
TX Transmitter
VGA Variable gain amplifier

What is claimed is:

1. A telecommunications receiver comprising:
   a first IQ mixer and a second IQ mixer,
   means for providing a received signal to the first mixer, the first mixer producing a first I signal and a first Q signal;
   means for providing a signal in antiphase to the received signal to the second mixer, the second mixer producing a second I signal and a second Q signal; and
   means for combining the first and second I signals in accordance with the relative phases of the first and second I signals and for combining the first and second Q signals in accordance with the relative phases of the first and second Q signals;
   wherein DC offset components present in the first and second I signals and in the first and second Q signals at least partially cancel.

2. The receiver of claim 1 wherein the first and second mixers are of the same type.

3. A telecommunications receiver comprising:
   a first IQ mixer and a second IQ mixer,
   means to provide a received signal to the second mixer in antiphase to the phase of the received signal provided to the first mixer, each mixer producing an I signal and a Q signal, the I signal from the second mixer being in phase or antiphase to the I signal from the first mixer, the Q signal from the second mixer being in phase or in antiphase to the Q signal from the first mixer, and
   means to produce a first output signal and means to produce a second output signal,
   the first output signal being the sum of the two I signals when the two I signals are in opposite phases or the difference between the two I signals when they are of the same phase, such that DC offset components present in the I signals at least partially cancel,
   the second output signal being the sum of the two Q signals when the two Q signals are of opposite phase or the difference between the two Q signals when they are of the same phase, such that DC offset components present in the Q signals at least partially cancel.

4. The receiver of claim 3 wherein the first and second mixers are of the same type.

5. The receiver according to claim 4, wherein in use the signal provided to the second mixer is the received signal in antiphase to the phase of the received signal provided to the first mixer.

6. The receiver according to claim 4, wherein in use the signal provided to the second mixer is a reference signal.

7. A receiver according to claim 4, wherein
   each mixer provides both in phase and in antiphase I signals,
   each mixer provides both in phase and in antiphase Q signals,
   the means to provide a first output signal comprises a first adder and a second adder,
   the means to provide a second output signal comprises a third adder and a fourth adder,
   the two in phase I signals are summed together by the first adder, the two in anti phase I signals are summed together by the second adder,
   the two in phase Q signals are summed together by the third adder,
   the two in anti phase Q signals are summed together by the fourth adder,
   wherein in the summations, the DC offset components at least partially cancel.

8. The receiver according to claim 4, wherein
   the first output signal is the difference between the two I signals provided as an output from a differential amplifier having the two I signals of opposite phases as inputs,
   the second output signal is the difference between the two Q signals provided as an output from a second differential amplifier (330') having the two Q signals of opposite phases as inputs.

9. A telecommunications transmitter comprising:
   a first IQ mixer and a second IQ mixer, in use each mixer being provided with an I signal and a Q signal, the I signal to the second mixer being in phase with the I signal to the first mixer, the Q signal to the second mixer being in phase with the Q signal to the first mixer, the second mixer providing an output signal in antiphase to an output signal provided by the first mixer, and
   means for combining the two output signals by phase shifting one of the signals by 180 degrees and adding this to the other output signal to produce a signal for transmission, wherein residual carrier components present in the two output signals at least partially cancel.

10. The transmitter of claim 9 wherein the first IQ-mixer and the second IQ-mixer are of the same type.

11. A transmitter according to claim 10, wherein
both in phase and in antiphase I signals are provided to each mixer, and
both in phase and in antiphase Q signals are provided to each mixer.

12. A method of receiving comprising:
mixing a received signal to produce a first I signal and a first Q signal;
mixing a signal in antiphase to the received signal to produce a second I signal and a second Q signal:
combining the first and second I signals in accordance with the relative phases of the first and second I signals; and
combining the first and second Q signals in accordance with the relative phases of the first and second Q signals;
wherein DC offset components present in the first and second I signals at least partially cancel, and DC components present in the first and second Q signals at least partially cancel.

13. The method of claim 12 wherein the steps of mixing are performed by IQ mixers of the same type.

14. A method of transmitting comprising:
mixing a Q signal and a signal in antiphase to the Q signal and an I signal and a signal in antiphase to the I signal to produce a first output signal;
mixing in reverse order the Q signal and the signal in antiphase to the Q signal and in reverse order the I signal and the signal in antiphase to the I signal to produce a second output signal;
combining the first and second output signals to produce a signal for transmission;
wherein residual carrier components present in the first and second output signals at least partially cancel.

15. The method of claim 14 wherein the steps of mixing are performed by IQ mixers of the same type.

* * * * *